United States Patent [19]
Kinnard et al.

[11] 3,949,278
[45] Apr. 6, 1976

[54] DOCUMENT TRANSFER DEVICE DRIVE

[75] Inventors: J. Rothe Kinnard, Austin; Errol Ray Williams, Jr., Leander, both of Tex.

[73] Assignee: International Business Machines Corporation, Armonk, N.Y.

[22] Filed: Dec. 31, 1974

[21] Appl. No.: 537,731

[52] U.S. Cl....... 317/137; 317/148.5 B; 317/DIG. 6
[51] Int. Cl.² .......................................... H03H 9/00
[58] Field of Search . 317/DIG. 6, 148.5 R, 148.5 B, 317/137, 146, DIG. 7

[56] References Cited
UNITED STATES PATENTS
3,243,665   3/1966   Fayer et al..................... 317/DIG. 7

*Primary Examiner*—R. N. Envall, Jr.
*Attorney, Agent, or Firm*—John L. Jackson

[57] ABSTRACT

A driving circuit for driving a number of solenoid type devices which have very accurate voltage requirements and which utilizes the inductive kick of both the driven devices and internal transformers to efficiently utilize power. A feedback path is provided to an integrated circuit regulator to provide an indication of the power being consumed by the devices. The integrated circuit regulator, along with accompanying circuitry, regulates the voltage output by a power driver such that the voltage output remains steady regardless of the number of solenoid type devices which are being operated. In addition, a feedback path is also provided from each of the driven devices and the internal transformers to the power source such that when the devices are deenergized logically, the inductive kick from each of the devices and the transformers is applied to the power source for power conservation as well as to prevent the necessity for having heat sinks to dissipate the power. In addition, this feedback to the power source is clamped at a controlled minimum voltage to protect the transistors in the power driver to prevent damage to them. The circuit thus provides an ideal current for driving an inductive load since the inductive kick results in a rapid fall of the current through the winding such that the armature of the solenoids can be returned to their deenergized position by an inexpensive spring arrangement.

9 Claims, 3 Drawing Figures

DOCUMENT TRANSFER DEVICE DRIVE

BACKGROUND OF THE INVENTION

1. Field of the Invention

This invention relates primarily to power driving circuits, and more particularly, to a power driving circuit which efficiently utilizes the power from inductively driven loads and internal transformers by returning this inductively derived power to the power source and in addition, monitors the voltage applied to the power sources during driving to provide an extremely regulated voltage amplitude.

2. Description of the Prior Art

In certain applications, such as in sheet feeding, solenoid type devices are required to drive a member in an intermittent motion. One such device is described in U.S. Pat. No. 3,747,921, to L. F. Knappe, entitled, "Document Feed Device". In this patent, as well as a copending application Ser. No. 537,732 entitled "Document Transport and Separating Device", by O. D. Johnson, filed on the same day as the subject application and assigned to a common assignee, there is provided one such device. In this patent and application a number of intermittent motion transport devices are utilized to propel paper along a paper path. The operation of these devices is such that a driving tip is driven by a solenoid such that the end of the tip moves in an elliptical path to propel the paper down the selected path. At the bottom of the ellipse, which is formed by the driving of the solenoid armature and the return of it to its unenergized position, the tip contacts the paper and drives it in the direction in which the ellipse is rotating. The voltage applied to the solenoids which drive the tips must be controlled and must remain constant regardless of the number of solenoids being driven at one time. In addition, efficient use of the power supply is also desired.

Previous drive circuits have either utilized heat sinks to dissipate the power induced by the inductive kick when the solenoids are deenergized such that the power is not only wasted, but additional costs are incurred due to the utilization of heat sinks. In addition, where multiple devices were connected to a power driver it was extremely difficult to control the voltage level to make the devices operate properly when the devices were being switched in and out of operation, and thus, a limited number of devices could be driven by a single source. The ideal solution to this control voltage problem was quite expensive in that to assure proper operation at the control voltage, single regulated power drivers were required for each of the solenoid type of devices. Obviously this last solution was quite expensive and did not result in a viable system even though reliable operation could be achieved.

SUMMARY OF THE INVENTION

A driving circuit for driving a number of solenoid type devices which have very accurate voltage requirements and which utilizes the inductive kick of both the driven devices and internal transformers to efficiently utilize power. A feedback path is provided to an integrated circuit regulator to provide an adjustable precentage of the power being consumed by the devices. The integrated circuit regulator, along with accompanying circuitry, regulates the voltage output by a power driver which includes a Darlington pair such that the voltage output remains steady regardless of the number of solenoid type devices which are being operated. Each solenoid is individually logical selected by providing a path to ground. In addition, a feedback path is also provided from each of the driven devices and the internal transformers to the power source such that when the devices are deenergized logically, the inductive kick from each of the devices and the transformers is applied to the power source for power conservation as well as to prevent the necessity for having heat sinks to dissipate the power. In addition, this feedback to the power source is clamped at a controlled minimum voltage to protect the pair of transistors in the power driver to prevent damage to them. The circuit thus provides an ideal current for driving an inductive load since the inductive kick results in a rapid fall of the current through the winding such that the solenoids can be returned to their inoperative state by an inexpensive spring arrangement.

DETAILED DESCRIPTION OF THE PREFERRED EMBODIMENT

Figure 1:
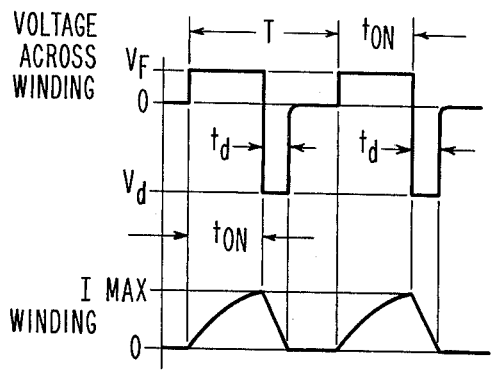
In FIG. 1 there is shown the required voltage and wave form for driving an intermittent document transport device as described in the copending application in an ideal manner such that the elliptical path which is desired is obtained.

As illustrated, the voltage $V_F$ must be constant during the time that it is being applied to the solenoids. This period is indicated by the time $t_{ON}$. Again still referring to FIG. 1, the solenoid essentially is an inductive device and the leading edge of the current wave form rises to its peak $I_{MAX}$. As previously discussed since the solenoid upon dropping of power to it has its armature returned by springs to its original position, the current in the solenoid must be rapidly dissipated. Thus, there is a rapid fall time required for the trailing edge of the current through the winding. To accomplish this, a relatively high voltage $V_d$ is allowed to build up by means of an inductive kick to a relatively high negative potential for a period $t_d$. The completion of the cycle is illustrated by the time $t$ at which time the voltage to the solenoids, selected for operation, is again applied. Thus, it can be seen that there must be a well regulated and constant voltage applied to the solenoids for an accurate period of time followed by a relatively rapid dissipation of current in the windings following deenergization or disconnection of power from the solenoids.

Figure 2:
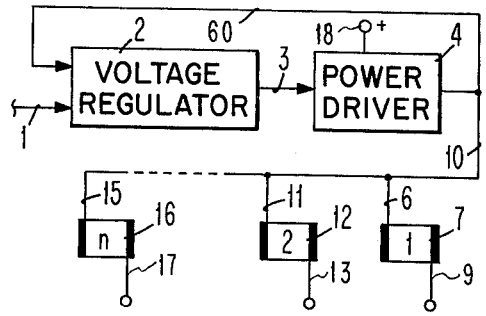
In FIG. 2 there is shown an overall schematic of the intermittent document transport device driver connected to a number of solenoids representative of the solenoids of the intermittent transport document devices.
Figure 3:
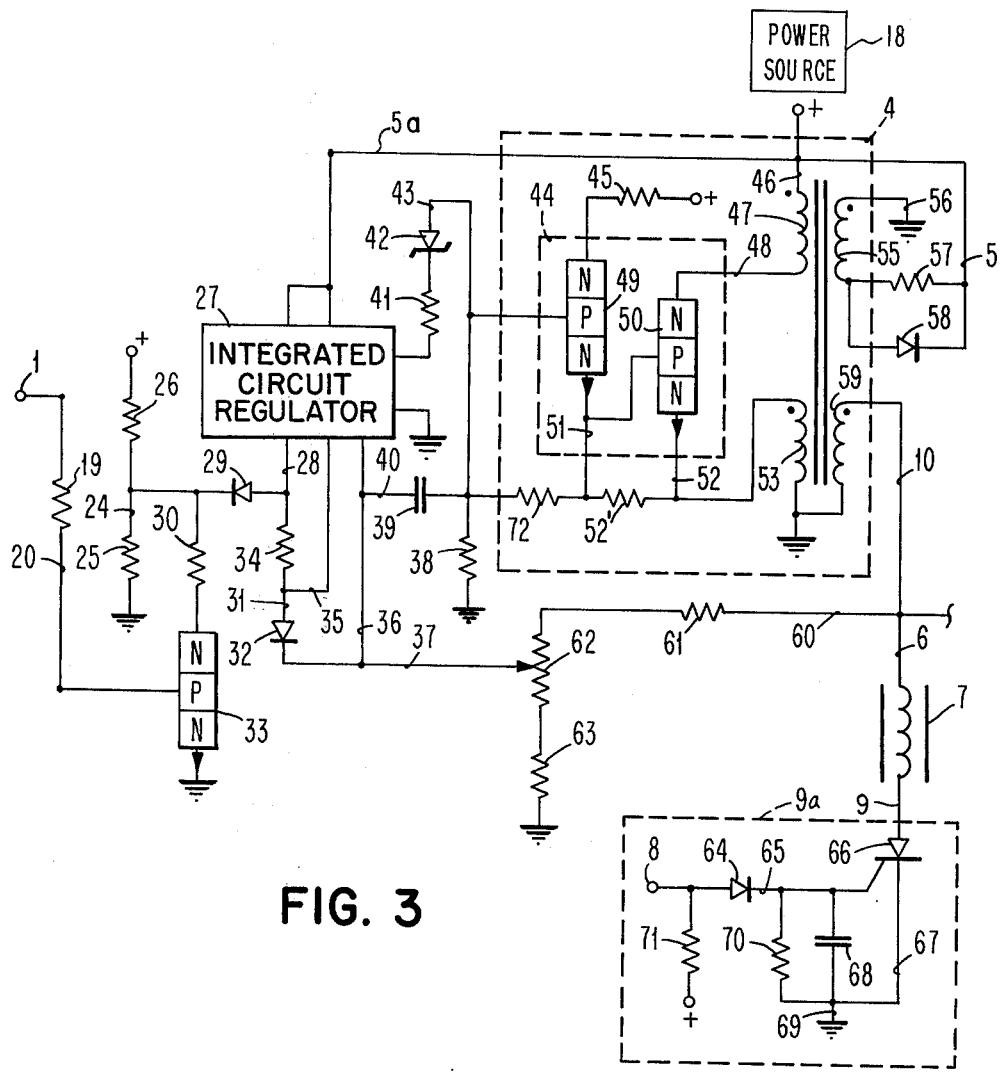
In FIG. 3 there is shown a detailed illustration of the overall system which provides the efficient utilization of inductive kick back power and the desired wave forms illustrated in FIG. 1 which accomplishes good operation of the intermittent document transport devices regardless of the number of devices which are being driven.

In FIG. 2 there is shown an overall illustration of the detailed system of FIG. 3. With the intermittent document transport device described in the copending application, ideally the tips of the devices are driven at 200 hz. Thus, a 200 hz square wave control signal is applied along line 1 to a voltage regulator 2 such that a 200 hz control signal is applied along line 3 to the power driver 4. The power driver 4 additionally is connected along line 10a to provide a feedback to the voltage regulator to control the voltage output by it as will later be described in detail in connection with FIG. 3. Also, the output of the power driver is applied along line 10 to lines 15, 11 and 6 to apply power to solenoids 16, 12 and 6 respectively. These solenoids have logical terminals 17, 13 and 9 which are utilized to provide a ground to them to energize them when power is applied. This will, again, be described in detail in connection with the block 9a of FIG. 3. The power driver itself derives power from a source not shown which is applied to terminal 18. It is to this not shown power source that power is not only derived from, but is returned to when the external solenoids are deenergized and provide an inductive kick. In addition, the power from the transformers internal to the power driver 4 is also applied to this source as again will be described in connection with FIG. 3.

For a more detailed description of the system, refer next to FIG. 3. Prior to this detailed description, however, reference will be made to the internal circuit regulator 27. This is not described in detail in the application, however, it is a regulator commercially available such as the regulator μA723-Precision Voltage Regulator shown and described in the November, 1971 Fairchild Semiconductor Catalog, "The Integrated Circuits Data Catalog" at page 53.

Still referring to FIG. 3 there is an input terminal 1 having a voltage square wave applied at the frequency at which the solenoids are to operate. This square wave would have a period correspond to T of FIG. 1 and would be at the down level near zero volts for a period of $t_{ON}$. This voltage square wave is applied through resistor 19 on line 20 to the base of NPN transistor 33. This causes transistor 33 to be driven into a saturated state while the input voltage is high and be turned off while the input voltage is low during the period $t_{ON}$. At the collector of transistor 33 there is a resistive dividing network made up of resistors 26, 25 and 30 which is driven by a positive potential applied to resistor 26. This resistor divider network causes voltage on line 24 to be, during the time the transistor 33 is off, the resultant voltage division caused by resistor 26 and resistor 25. When transistor 33 is on or in the saturated state, the voltage on line 24 will be at a lower level as determined by resistor 26 and the parallel combinations of resistor 25 and 30. This voltage square wave which is then produced on line 24 is applied through diode 29 and along line 28 to the non-inverting inputs of the differential amplifier in the integrated circuit regulator 27.

When the voltage on line 24 is at its high level with transistor 33 in an off state, the voltage on line 28 of the non-inverted input will be determined by the reference voltage on the integrated circuit regulator line 35. This is due to the fact that there will be no current through resistor 34 into the regulator and therefore there will be no voltage drop across it at that time. When the voltage on line 24 is at the lower level which is when transistor 33 is saturated, diode 29 will be in a forward biased state since the voltage level on line 24 is lower than the reference voltage on line 35. Current will then flow through resistor 34 and lower the voltage on line 28 to the integrated circuit regulator below the reference level on line 35. This causes the output of the regulator in the integrated circuit regulator which is applied to line 40 to resistor 41 to switch between an up regulating level from the off state.

Also connected to the reference line 35 along line 31 is a diode 32 which has its anode connected to the inverting input line 36 of the differential amplifier in the integrated circuit regulator 27. The function of diode 32 is to protect the differential amplifier of the regulator from the differential voltages during the start up condition of the circuit.

The integrated circuit regulator applies a correct voltage to resistor 41 which produces the regulated voltage on line 10 as will later be described. Zener diode 42 serves simply as a voltage shifting component to change the voltage level at the output of the integrated circuit regulator to the proper level to drive the power stages in block 44. Line 43 connects the anode of zener diode 42 to the base of NPN transistor 49 which forms the first stage of the Darlington pair in block 44. This is a typical Darlington connection made up of transistors 49 and 50 both of which are NPN devices. The regulator thus will supply a current to the base of transistor 49 to cause the voltage on the solenoid 7 to be at the proper $V_F$ level during the time $t_{ON}$ as will later be described in detail. Also at the base of transistor 49 is connected a capacitor 39 which is connected along line 40 to the inverting input line 36 of the regulator which increases the AC stability of the feedback circuit. Resistors 38 and 72 are also connected to the base of transistor 49 and serve to turn off the transistor when the voltage at the output of the integrated circuit regulator goes to a down level. Transistor 49 also has a resistor 45 between its collector and the power source to limit the maximum current through the transistor.

The emitter of transistor 49 is connected to the base of transistor 50 as is normal in a Darlington configuration to provide base current to transistor 50. Transistor 50 is connected between two windings, windings 47 and 53 of the output transformer. When transistor 50 is in a conducting state, which results from an up level at the output of the integrated circuit regulator, current will flow from the power source 18 along line 46 and through winding 47 and through line 48 to the collector of transistor 50. The current path is then through transistor 50 to the emitter line 52 and thence through winding 53 to ground. Resistor 52' which is connected between the emitter of transistor 50 serves a similar purpose as resistors 72 and 38 associated with transistor 49 to assist in turning off transistor 50 when the output of the integrated circuit regulator is at a low level. That is, its base is connected through resistors 52', 72 and 38 to ground. When transistor 50 is in an on state and current is flowing through windings 47 and 53, the voltage determined by the turns ratio of the sum of the turns on windings 47 and 53 to the number of turns in winding 59 of the transformer, taken with the ratio times the voltage difference between the power source and the voltage across transistor 50, then appears on line 10. This voltage is then applied to line 6, 11 and any other connecting lines such as 15, and (FIG. 2) to the solenoids. If the other end of the solenoid such as solenoid 7 is connected to a ground potential through the control circuit such as the one shown in block 9a then the voltage appearing at line 10 will be impressed across the solenoid. This would be $V_F$ shown in FIG. 1.

In order to determine that the correct voltage is present on line 10, line 60 connects this potential to resisted dividers 61, 62, and 63. Resistor 62 is a variable resistor which allows feeding back on line 37 a precentage of the voltage on line 10 which is determined by the setting of resistor 62. This output of the divider is then fed back to the inverting input of the voltage regulator 27 along lines 37 and 36. The purpose of this feedback path is to allow a comparison of a percentage of the voltage on line 10 to the internal reference of the regulator voltage on line 35 and change the output of the regulator connected to the resistor 41 to a higher or lower level to maintain this voltage at the output line 10 at a proper level. This regulation effect only occurs while the input voltage at input 1 is in the down level and transistor 33 is an off state. When the input voltage at input 1 rises to an up level transistor 33 is saturated and the reference at the non-inverting input of the regulator goes to a much lower level and transistors 49 and 50 are forced into a non-conducting state by the output of the regulator. This occurs at the end of the period $t_{ON}$. At that time a maximum current has been reached through the windings 47 and 53 of the transformer due to the conductive property of the primary of these windings of the transformer and through the solenoids attached to line 10. Obviously, only those having their opposite ends driven to ground by the switch as shown in block 9a would have a current through them at this time. This represents an amount of stored energy which is one-half the inductance of the solenoids times the currents squared in each of these devices. At the time that transistor 50 is switched to a non-conducting state by the input going to an up level, this stored energy then causes the voltage at line 48 to rise toward an up level (a higher level than the voltage at the terminal 46) and the voltage at the dotted end of winding 53 to go to a negative level. At this same time, the voltage on line 10 will go to a negative level relative to ground. The voltage across winding 55, because of its phasing with winding 59 will go to a positive level relative to ground. The final voltage level to which the different points will go is determined by the first current path which occurs as the voltage increases. The first current path which occurs is when the voltage on winding 55 reaches the power source 18 level and diode 58 becomes forward biased and conducts the current from ground through line 56 and winding 55 through resistor 57 into line 5 and thus back to the power source. With this diode conducting, the energy stored in the solenoids connected to line 10 and in the transformer, flows through diode 58 back into the power source. That is, the energy that was stored in the various inductances is now transferred back to the power source without being dissipated. The turns ratio of windings 55 and 59 is selected to give a higher voltage $V_d$ in the reverse direction when line 10 is negative than was applied during the time $t_{ON}$ at the level $V_F$. This allows the current to decay in the solenoids and in the transformer at a much higher rate than it was built up during the period $t_{ON}$ to allow a faster release of force in the solenoid than would be passable at a lower voltage.

A resistor 57 is attached across diode 58 between the non-grounded side of winding 55 and line 5. This produces a bias current which flows from the power source through winding 55 to ground to line 56 to reset the core to a near zero flux state at the beginning of each cycle. This assists in reducing the peak currents in the transistor 50 caused by the primary inductance of the transformer. It in effect decreases the effective inductance of the windings of the transformer by resetting the core to a near zero initial state rather than letting it reside at the residual level. Its purpose is to compensate for the property of the core material.

In block 9a is a typical switch which could be used to control the solenoids individually. Its purpose is to provide a conductive path from the lower end of the solenoid such as number 7 to ground during the period $t_{ON}$ if solenoid 7 is to be operated. A logical signal is applied to terminal 8 by the control means which is not shown and forms no part of the present invention. The control device shown is a silicon controlled rectifier 66. It will conduct current from the solenoid to ground through lines 67 and 69 if a positive gate signal is applied through line 65. In the case of a logic level driving terminal 8, the logic level required is an up level meaning that no current is drawn from terminal 8. A current will flow through resistor 71 which is connected to the positive potential and diode 64 through line 65 to the gate of the silicon controlled rectifier 66 and cause it to be conductive. When the terminal 8 is at the down level then this current path would be eliminated. That is, the current through resistor 71 would go out through terminal 8 to the logic and not be driven into the gate of the silicon controlled rectifier. Resistor 70 between lines 65 and 69 and capacitor 68 between lines 65 and 69 serve as an integrating network to reduce the noise susceptibility of the device.

In summary, a driving circuit for driving a number of solenoid type devices which have very accurate voltage requirements and which utilizes the inductive kick of both the driven devices and internal transformers to efficiently utilize power. A feedback path is provided to an integrated circuit regulator to provide an indication of the power being consumed by the devices. The integrated circuit regulator, along with accompanying circuitry, regulates the voltages output by a power driver such that the voltage output remains steady regardless of the number of solenoid type devices which are being operated. In addition, a feedback path is also provided from each of the driven devices and the internal transformers of the power source such that when the devices are deenergized logically, the inductive kick from each of the devices and the transformers is applied to the power source for power conservation as well as to prevent the necessity for having heat sinks to dissipate the power. In addition, this feedback to the power source is clamped at a controlled minimum voltage to protect the transistors in the power driver to prevent damage to them. The circuit thus provides an ideal current for driving an inductive load since the inductive kick results in a rapid fall of the current through the windings such that the armature of the solenoids can be returned to their deenergized position by an inexpensive spring arrangement.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A circuit for providing cyclical power from a power source to an overall varying effective inductive load with the voltage applied to the load remaining substantially constant as the load varies, said circuit comprising:

a power driver connected to said power source, a plurality of individual inductive loads making up said varying inductive load connected to said power driver, a voltage regulator for controlling the output voltage level of said power driver, means for cyclically driving said voltage regulator to cause said power driver to cyclically apply a predetermine voltage of a first plurality to said individual inductive loads, and means for rapidly dissipating power in said individual inductive loads following each application of said predetermine voltage thereto including means for producing a substantially greater voltage of opposite polarity from said individual inductive loads while applying said such produced voltage to said power source.

2. The circuit of claim 1 wherein said individual inductive loads are solenoids having armatures and windings with said windings, following application of said predetermined voltage to them which results in the buildup of a magnetic field providing a portion of the said substantially greater voltage of opposite polarity to said power source upon the collapse of said magnetic fields when said predetermined voltage is removed.

3. The circuit of claim 2 wherein said solenoids are connected to an external switch such that they may be selectively connected to said predetermined voltage of said first polarity.

4. The circuit of claim 3 wherein the said predetermined voltage is measured during each cycle and fed back to said voltage regulator to cause said predetermined voltage to remain substantially constant regardless of the number of said solenoids connected thereto.

5. The circuit of claim 4 wherein said power driver further includes an output transformer also having a magnetic field built up therein which provides a portion of said substantially greater voltage of said opposite polarity.

6. The circuit of claim 5 wherein said voltage regulator controlls a pair of output transistors which selectively couple said output transformer to said power source.

7. The circuit of claim 6 wherein said output transformer includes two secondary windings, the first of which provides said predetermined voltage to said polarity to said solenoids.

8. The circuit of claim 7 wherein the second of said pair of secondary windings provides said substantially greater voltage of opposite polarity to said power source.

9. The circuit of claim 8 wherein said second secondary winding of said output transformer has a diode connected in series between it and said power source to isolate it from said power source during the time of application of said predetermined voltage of said first polarity and during the time of application of said predetermined voltage of said substantially greater voltage of said opposite polarity being operative to allow said substantially greater voltage to flow into said power source.

* * * * *